(12) United States Patent
Luebs

(10) Patent No.: US 6,906,924 B2
(45) Date of Patent: Jun. 14, 2005

(54) TEMPERATURE-CONTROLLED REWORK SYSTEM

(75) Inventor: Richard J. Luebs, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/439,354

(22) Filed: May 16, 2003

(65) Prior Publication Data

US 2004/0228089 A1 Nov. 18, 2004

(51) Int. Cl.⁷ .............................................. H05K 7/20
(52) U.S. Cl. ..................... 361/719; 361/689; 361/690; 228/200; 228/9
(58) Field of Search .................. 361/688–695, 361/698–699, 719–720; 174/16.1, 16.2; 165/80.3, 80.4, 104.33; 257/712, 721; 228/119, 179.1, 180.21

(56) References Cited

U.S. PATENT DOCUMENTS

| | | | | |
|---|---|---|---|---|
| 4,278,867 A | * | 7/1981 | Tan ........................ 219/121.64 |
| 4,805,827 A | * | 2/1989 | Coffman et al. ............ 228/20.1 |
| 5,394,299 A | * | 2/1995 | Chu et al. .................... 361/705 |
| 5,491,610 A | * | 2/1996 | Mok et al. ................... 361/695 |
| 5,598,965 A | * | 2/1997 | Scheu ......................... 228/6.2 |
| 6,034,875 A | * | 3/2000 | Heim et al. .................. 361/719 |
| 6,182,884 B1 | * | 2/2001 | Ma et al. ..................... 228/119 |
| 6,188,189 B1 | * | 2/2001 | Blake .......................... 318/471 |
| 6,213,195 B1 | * | 4/2001 | Downing et al. ........... 165/80.4 |
| 6,282,096 B1 | * | 8/2001 | Lo et al. ...................... 361/704 |
| 6,347,734 B1 | * | 2/2002 | Downes .................. 228/180.21 |
| 6,349,385 B1 | * | 2/2002 | Kaminski et al. ............ 713/300 |
| 6,384,733 B1 | * | 5/2002 | Seesemann .................. 340/648 |
| 6,425,515 B2 | * | 7/2002 | Mays et al. .................. 228/103 |
| 6,487,463 B1 | * | 11/2002 | Stepp, III ..................... 700/79 |
| 6,549,026 B1 | * | 4/2003 | DiBattista et al. ........... 324/760 |
| 6,572,009 B2 | * | 6/2003 | Graves et al. ............ 228/179.1 |
| 6,628,002 B2 | * | 9/2003 | Ritz et al. .................... 257/712 |

* cited by examiner

*Primary Examiner*—Boris Chervinsky

(57) ABSTRACT

A temperature-controlled rework system comprises a manifold assembly adapted to direct a cooling gas flow toward an area of a printed circuit board adjacent a rework zone to reduce a temperature of the adjacent area to below a temperature of the rework zone. The system also comprises a temperature control system adapted to monitor the temperature of the adjacent area.

32 Claims, 1 Drawing Sheet

TEMPERATURE-CONTROLLED REWORK SYSTEM

TECHNICAL FIELD OF THE INVENTION

The present invention relates generally to the field of electronic equipment and, more particularly, to a temperature-controlled rework system.

BACKGROUND OF THE INVENTION

As the functionality and sophistication of electronic equipment increases, the complexity of the electronic equipment also increases. For example, electronic equipment often comprise a single- or multi-layer printed circuit board containing a variety of electronic components, such as application specific integrated circuits. Additionally, the density of the electronic components on the printed circuit board also increases.

In the course of testing, assembly or use, electronic components on the printed circuit board may require removal or replacement. However, the density of the components on the printed circuit board generally makes component replacement a difficult and delicate task. For example, one method for replacing an electronic component includes directing a stream of high temperature gas toward the component to soften or re-liquefy the solder coupling the component to the circuit board. However, adjacent components become a concern because the high temperature gas may re-liquefy adjacent component solder-connections, thereby possibly causing a disconnection between the adjacent component and the circuit board. Additionally, the high temperature gas flow may detrimentally affect the adjacent component.

SUMMARY OF THE INVENTION

In accordance with one embodiment of the present invention, a temperature-controlled rework system comprises a manifold assembly adapted to direct a cooling gas flow toward an area of a printed circuit board adjacent a rework zone to reduce a temperature of the adjacent area to below a temperature of the rework zone. The system also comprises a temperature control system adapted to monitor the temperature of the adjacent area.

In accordance with another embodiment of the present invention, a rework manifold assembly comprises a manifold having a plurality of apertures adapted to direct a gas flow to an area of a printed circuit board adjacent a rework zone. The rework manifold also comprises a plurality of supports adapted to support the manifold.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE DRAWINGS

Figure 1:
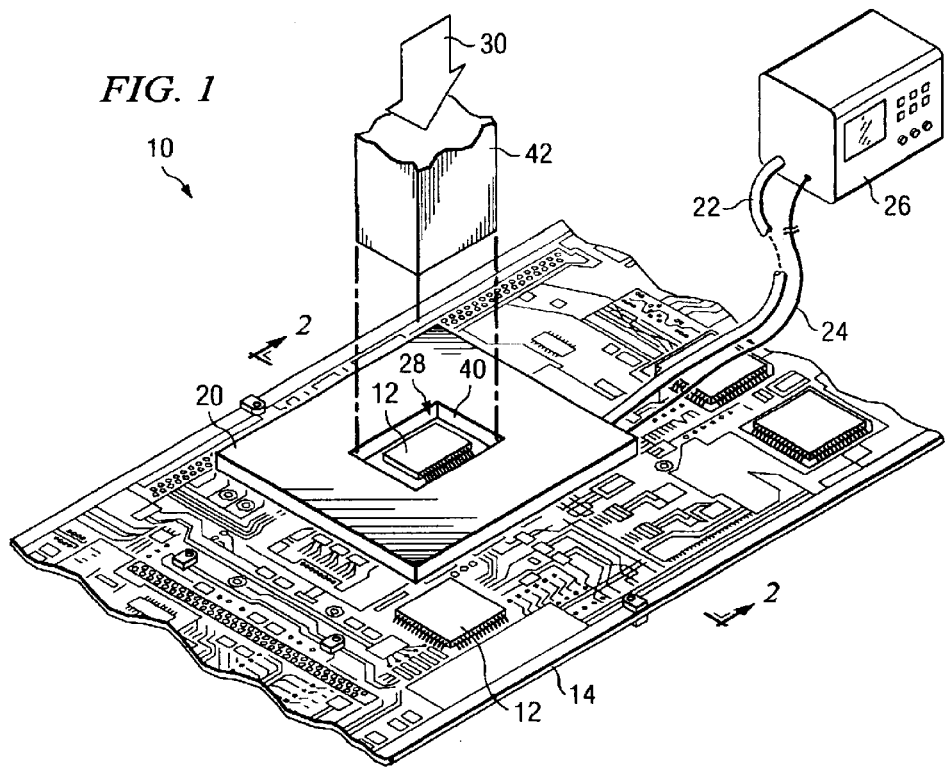
FIG. 1 is a diagram illustrating an embodiment of a temperature-controlled rework system in accordance with the present invention.
Figure 2:
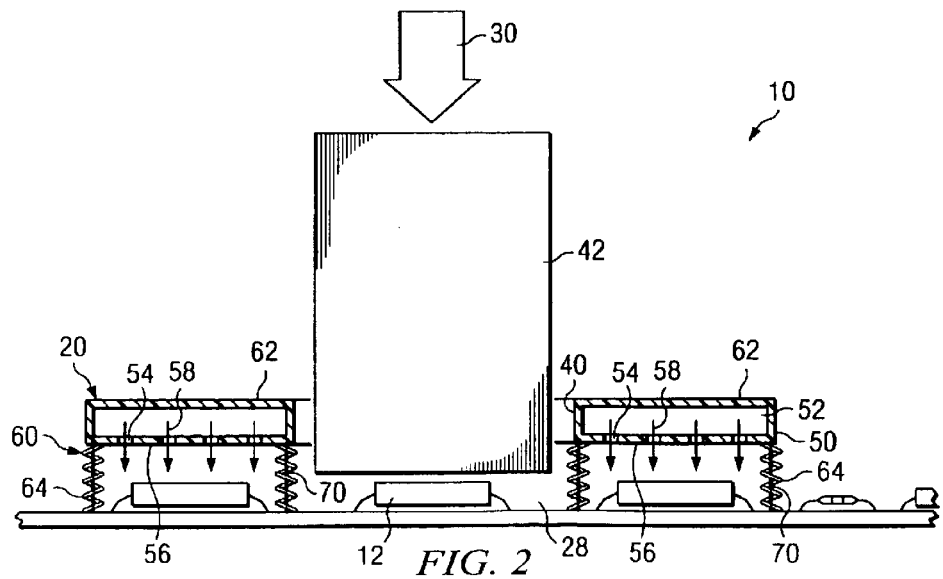
FIG. 2 is a diagram illustrating a side view of the temperature-controlled rework system illustrated in FIG. 1.

The preferred embodiments of the present invention and the advantages thereof are best understood by referring to FIGS. 1 and 2 of the drawings, like numerals being used for like and corresponding parts of the various drawings.

FIG. 1 is a diagram illustrating an embodiment of a temperature-controlled rework system 10 in accordance with the present invention. Briefly, system 10 is used to enable or assist in the removal of an electronic component 12 from a printed circuit board 14 or other type of electronic structure. For example, electronic component 12 may comprise an integrated circuit, resistor, capacitor, or any other type of device soldered to printed circuit board 14. In the embodiment illustrated in FIG. 1, system 10 comprises a manifold assembly 20, a gas flow system 22, a temperature control system 24, and a controller 26 to monitor and regulate temperature levels surrounding or adjacent to a rework zone 28. As used herein, "rework zone" comprises an area about a particular component 12 to receive a relatively high temperature gas flow 30 for re-liquefying solder connecting the particular component 12 to printed circuit board 14 to enable or assist in the removal of the particular component 12.

Briefly, air flow system 22 delivers a relatively cool or low temperature gas flow to manifold assembly 20 for cooling or maintaining areas of printed circuit board 14 adjacent to rework zone 28 at a reduced temperature to substantially prevent the re-liquification of solder attachments of adjacent components 12, thereby maintaining the adjacent components 12 at a reduced temperature and protecting the adjacent components 12 from elevated temperatures which may otherwise detrimentally affect the adjacent components 12. In the embodiment illustrated in FIG. 1, manifold assembly 20 comprises a centrally disposed opening 40 for receiving a nozzle 42 which may be used to direct a high temperature gas flow 30 into rework zone 28 to re-liquefy solder attaching a particular component 12 to printed circuit board 14. However, it should be understood that other devices or methods for directing the high temperature gas flow 30 into rework zone 28 may be used. Additionally, manifold assembly 20 may also be formed having different geometric characteristics to accommodate different types of devices which may be used to deliver the high temperature gas flow 30 to rework zone 28. Thus, in operation, manifold assembly 20 receives a reduced temperature gas flow via air flow system 22 and directs the reduced temperature air flow about a perimeter of rework zone 28 to maintain components 12 in areas adjacent to rework zone 28 at a reduced temperature.

Temperature control system 24 is used to monitor the temperature of areas of printed circuit board 14 adjacent rework zone 28. Controller 26 is coupled to temperature control system 24 and air flow system 22 to regulate the reduced temperature air flow delivered to manifold assembly 20 based on temperatures of areas of printed circuit board 14 adjacent to rework zone 28. Controller 26 may comprise a computer, workstation, or other type of processing device or system. Controller 26 may be used to regulate the temperature of the reduced temperature air flow delivered to manifold assembly 20 and/or regulate the volume of the reduced temperature air flow delivered to manifold assembly 20. Thus, in operation, temperature control system 24 monitors and determines temperature conditions of areas adjacent to rework zone 28 so that controller 26 may regulate the reduced temperature air flow delivered to manifold assembly 20 via air flow system 22 to prevent adjacent areas and components 12 of printed circuit board 14 from being exposed to elevated temperatures which may otherwise detrimentally affect the adjacent components 12.

FIG. 2 is a section view taken along the line 2—2 of FIG. 1 illustrating system 10. As illustrated in FIG. 2, nozzle 42 may be inserted within opening 40 of manifold assembly 20 in close proximity to a particular component 12 within rework zone 28 to direct the high temperature gas flow 30 into rework zone 28 to re-liquefy solder attachments for component 12 within rework zone 28. In the embodiment illustrated in FIG. 2, manifold assembly 20 comprises a manifold 50 having an internal cavity 52 for receiving the reduced temperature air flow from air flow system 22. Manifold 50 also comprises a plurality of apertures 54 disposed in a downwardly facing wall 56 to direct the reduced temperature gas flow, indicated generally at 58, from within cavity 52 towards areas of printed circuit board 14 and components 12 disposed adjacent to rework zone 28. Apertures 54 may be disposed in any variety of arrays or geometric patterns to provide equal or unequal distributions of reduced temperature gas flow 58 to areas of printed circuit board 14 adjacent rework zone 28. For example, manifold 50 may be configured having a greater concentration of apertures 54 disposed near rework zone 28 and a lesser concentration of apertures 54 disposed near areas farthest from rework zone 28 to provide greater temperature reduction in the areas of printed circuit board 14 immediately adjacent to rework zone 28. The sizes of apertures 54 may also be varied to provide increased volumes of gas flow 58 to areas immediately adjacent to rework zone 28. However, it should be understood that other patterns, arrangements, sizes, and/or arrays of apertures 54 may be used on manifold 50.

As illustrated in FIG. 2, manifold assembly 20 also comprises a plurality of supports 60 for supporting manifold 50 proximate to rework zone 28. Preferably, supports 60 comprise flexible members to accommodate height variations relative to printed circuit board 14 caused by various sizes of components 12 or other structure so that a downward force may be applied to an upper surface 62 of manifold 50 to maintain a desired position of manifold 50 relative to printed circuit board 14 and/or rework zone 28. For example, in the embodiment illustrated in FIG. 2, supports 60 comprise springs 64 to accommodate height variations in printed circuit board 14; however, it should be understood that other types of flexible supports 60 may be used. Additionally, it should be understood that other types of supports 60, both flexible and rigid, may be used to support manifold 50 a desired distance relative to printed circuit board 14 and/or rework zone 28.

In the embodiment illustrated in FIG. 2, temperature control system 24 comprises temperature sensors 70 for monitoring a temperature of areas of printed circuit board 14 adjacent to rework zone 28. Temperature sensors 70 may comprise thermocouples or other types of devices for monitoring temperature conditions. As illustrated in FIG. 2, temperature sensor 70 are disposed at varying distances from rework zone 28 to enable a temperature profile to be obtained for areas of printed circuit board 14 adjacent to rework zone 28. In FIG. 2, temperature sensors 70 extend downwardly from manifold 50 through springs 64 to a location proximate to printed circuit board 14; however, it should be understood that the locations and/or positions of temperature sensors 70 may be otherwise located relative to manifold 50 and printed circuit board 14.

Thus, in operation, high temperature gas flow 30 is directed downwardly to rework zone 28 to re-liquefy solder attaching a particular component 12 disposed within rework zone 28. Meanwhile, reduced temperature gas flow 58 is delivered from air flow system 22 to manifold assembly 20 where manifold 50 distributes reduced temperature gas flow 58 to areas adjacent to rework zone 28 to maintain the adjacent areas at a reduced temperature. Based on a temperature and/or temperature profile of areas adjacent rework zone 28 as determined via temperature control system 24, controller 26 regulates the temperature and/or flow rate of the reduced temperature gas flow 58 delivered to manifold assembly 20 via air flow system 22. Thus, system 10 reduces the temperature of the areas of printed circuit board 14 adjacent to rework zone 28 and provides a method of maintaining adjacent areas and components 12 of printed circuit board 14 preferably at a reduced temperature relative to rework zone 28, thereby protecting adjacent components 12 from elevated temperatures which may otherwise detrimentally affect the adjacent components 12.

What is claimed is:

1. A temperature-controlled rework system, comprising:
   a manifold assembly adapted to direct a cooling gas flow toward an area of a printed circuit board adjacent a rework zone to reduce a temperature of the adjacent area to below a temperature of the rework zone; and
   a temperature control system adapted to monitor the temperature of the adjacent area.

2. The system of claim 1, wherein the manifold assembly comprises a manifold having a plurality of apertures adapted to direct the cooling gas flow to the adjacent area.

3. The system of claim 1, wherein the manifold assembly comprises a plurality of supports adapted to support the manifold assembly.

4. The system of claim 1, wherein the temperature control system comprises at least one temperature sensor disposed proximate to the rework zone.

5. The system of claim 1, wherein the manifold assembly comprises a plurality of flexible supports adapted to support the manifold assembly.

6. The system of claim 1, wherein the manifold assembly comprises an opening adapted to receive a rework nozzle.

7. The system of claim 1, further comprising a gas flow system adapted to supply the cooling gas flow to the manifold assembly.

8. The system of claim 1, wherein the manifold assembly is adapted to direct the cooling gas flow about a perimeter of the rework zone.

9. The system of claim 1, wherein the manifold assembly comprises a plurality of spring supports adapted to support the manifold assembly.

10. The system of claim 1, further comprising a controller adapted to regulate the cooling gas flow based on a temperature of the adjacent area.

11. A temperature-controlled rework system, comprising:
    means for directing a cooling gas flow toward an area of a printed circuit board adjacent a rework zone to reduce a temperature of the adjacent area to below a temperature of the rework zone; and
    means for monitoring the temperature of the adjacent area.

12. The system of claim 11, further comprising means for regulating a temperature of the cooling gas flow based on the temperature of the adjacent area.

13. The system of claim 11, wherein the means for directing the cooling gas flow comprises means for receiving a rework nozzle.

14. The system of claim 11, wherein the means for directing the cooling gas flow comprises means for supporting the means for directing the cooling gas flow.

15. The system of claim 11, further comprising means for regulating a flow rate of the cooling gas flow based on the temperature of the adjacent area.

16. A rework manifold assembly, comprising:
a manifold having a plurality of apertures adapted to direct a gas flow to an area of a printed circuit board adjacent a rework zone; and
a plurality of supports adapted to support the manifold a desired distance from the printed circuit board in response to a force applied to the manifold toward the printed circuit board.

17. The manifold assembly of claim 16, wherein the manifold is adapted to support at least one temperature sensor proximate to the rework zone.

18. The manifold assembly of claim 16, wherein the manifold is adapted to receive a rework nozzle.

19. The manifold assembly of claim 16, wherein the manifold is adapted to direct the gas flow about a perimeter of the rework zone.

20. The manifold assembly of claim 16, wherein the supports comprise flexible supports adapted to support the manifold.

21. The manifold assembly of claim 16, wherein the manifold comprises a centrally disposed opening adapted to receive a rework nozzle.

22. A rework manifold assembly, comprising:
a manifold having a plurality of apertures adapted to direct a gas flow to an area of a printed circuit board adjacent a rework zone; and
a plurality of supports adapted to extend from the manifold to the printed circuit board to support the manifold a desired distance from the printed circuit board.

23. The manifold assembly of claim 22, wherein the supports are adapted to accommodate height variations of the printed circuit board.

24. The manifold assembly of claim 22, wherein the supports comprise flexible supports.

25. The manifold assembly of claim 22, wherein the supports comprise springs.

26. The manifold assembly of claim 22, wherein the supports are adapted to support the manifold the desired distance from the printed circuit board in response to a force applied to the manifold toward the printed circuit board.

27. The manifold assembly of claim 22, wherein the manifold comprises a centrally disposed opening adapted to receive a rework nozzle.

28. A rework manifold assembly, comprising:
a manifold having a plurality of apertures adapted to direct a gas flow to an area of a printed circuit board adjacent a rework zone; and
a plurality of supports extending from the manifold to the printed circuit board and adapted to accommodate height variations of components on the printed circuit board.

29. The manifold assembly of claim 28, wherein the supports comprise flexible supports.

30. The manifold assembly of claim 28, wherein the supports comprise springs.

31. The manifold assembly of claim 28, wherein the supports are adapted to support the manifold a desired distance from the printed circuit board in response to a force applied to the manifold toward the printed circuit board.

32. The manifold assembly of claim 28, wherein the manifold comprises a centrally disposed opening adapted to receive a rework nozzle.

* * * * *